US011908898B2

(12) United States Patent
Wang et al.

(10) Patent No.: US 11,908,898 B2
(45) Date of Patent: Feb. 20, 2024

(54) LATERAL BIPOLAR TRANSISTOR STRUCTURE WITH BASE LAYER OF VARYING HORIZONTAL WIDTH AND METHODS TO FORM SAME

(71) Applicant: GlobalFoundries U.S. Inc., Malta, NY (US)

(72) Inventors: Haiting Wang, Clifton Park, NY (US); Hong Yu, Clifton Park, NY (US); Zhenyu Hu, Clifton Park, NY (US); Alexander M. Derrickson, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 26 days.

(21) Appl. No.: 17/456,943

(22) Filed: Nov. 30, 2021

(65) Prior Publication Data

US 2023/0067523 A1    Mar. 2, 2023

Related U.S. Application Data

(60) Provisional application No. 63/240,055, filed on Sep. 2, 2021.

(51) Int. Cl.
*H01L 29/10* (2006.01)
*H01L 29/735* (2006.01)
*H01L 29/66* (2006.01)

(52) U.S. Cl.
CPC ...... *H01L 29/1008* (2013.01); *H01L 29/6625* (2013.01); *H01L 29/735* (2013.01)

(58) Field of Classification Search
CPC ............... H01L 27/067; H01L 27/0722; H01L 27/0783; H01L 29/1008; H01L 29/1004;
(Continued)

(56) References Cited

U.S. PATENT DOCUMENTS 5,286,996 A * 2/1994 Neudeck ............... H01L 29/732
257/586
6,372,596 B1 * 4/2002 Havemann ............ H01L 29/735
257/E29.187

(Continued)

OTHER PUBLICATIONS

Siddiqui, A. "Design Considerations for 4H-SiC Lateral BJTs for High Temperature Logic Applications" Jour. of the Elec. Dev. Soc. vol. 6, Jan. 8, 2018 pp. 126-134 (Year: 2018).*

*Primary Examiner* — Grant S Withers
(74) *Attorney, Agent, or Firm* — Francois Pagette; Hoffman Warnick LLC

(57) ABSTRACT

Embodiments of the disclosure provide a lateral bipolar transistor with a base layer of varying horizontal thickness, and related methods to form the same. A lateral bipolar transistor may include an emitter/collector (E/C) layer on a semiconductor layer. A first base layer is on the semiconductor layer and horizontally adjacent the E/C layer. The first base layer has a lower portion having a first horizontal width from the E/C layer. The first base layer also has an upper portion on the lower portion, with a second horizontal width from the E/C layer greater than the first horizontal width. A second base layer is on the first base layer and adjacent a spacer. The upper portion of the first base layer separates a lower surface of the second base layer from the E/C layer.

20 Claims, 12 Drawing Sheets

(58) Field of Classification Search
CPC . H01L 29/0808; H01L 29/0684; H01L 29/06; H01L 29/0603; H01L 29/6625; H01L 29/735; H01L 29/66234
USPC .............. 257/586, 565, 575, 576, 578, 592
See application file for complete search history.

(56) References Cited

U.S. PATENT DOCUMENTS

| | | |
|---|---|---|
| 6,949,764 B2 | 9/2005 | Ning |
| 8,288,758 B2 | 10/2012 | Ning et al. |
| 8,420,493 B2 | 4/2013 | Ning et al. |
| 8,586,441 B1 | 11/2013 | Cai et al. |
| 10,825,921 B2 | 11/2020 | Balakrishnan et al. |
| 2016/0087068 A1* | 3/2016 | Cai .................... H01L 29/7317 257/526 |

* cited by examiner

US 11,908,898 B2

LATERAL BIPOLAR TRANSISTOR STRUCTURE WITH BASE LAYER OF VARYING HORIZONTAL WIDTH AND METHODS TO FORM SAME

BACKGROUND

The present disclosure relates to bipolar transistors. Present technology is at atomic level scaling of certain microdevices such as logic gates, bipolar transistors, field effect transistors (FETs), and capacitors. Circuit chips with millions of such devices are common. The structure of a bipolar transistor defines several of its properties during operation. Conventional integrated circuits may employ vertical bipolar transistors or other types of bipolar transistors, but these types of devices may have higher costs and/or operational parameters that do not meet certain constraints. Improving the electrical behavior of a bipolar transistor may provide related improvements in a device.

SUMMARY

The illustrative aspects of the present disclosure are designed to solve the problems herein described and/or other problems not discussed.

Embodiments of the disclosure provide a lateral bipolar transistor structure including: an emitter/collector (E/C) layer on a semiconductor layer; a first base layer on the semiconductor layer and horizontally adjacent the E/C layer and including a lower portion having a first horizontal width from the E/C layer, and an upper portion on the lower portion and having a second horizontal width from the E/C layer greater than the first horizontal width; and a second base layer on the first base layer and adjacent a spacer, wherein the upper portion of the first base layer separates a lower surface of the second base layer from the E/C layer.

Other embodiments of the disclosure provide a lateral bipolar transistor structure including: a semiconductor layer on an insulator; an emitter/collector (E/C) layer on the semiconductor layer, the E/C layer having a first doping type; and a first base layer on the semiconductor layer and horizontally adjacent the E/C layer, the first base layer having a second doping type opposite the first doping type and including: a lower portion having a first horizontal width from the E/C layer, and an upper portion on the lower portion and having a second horizontal width from the E/C layer greater than the first horizontal width; a spacer on the upper portion of the first base layer and adjacent the E/C layer, wherein an upper portion of the E/C layer is adjacent the spacer and a lower portion of the E/C layer is below the spacer; and a second base layer on the first base layer and adjacent the spacer, the second base layer having the first doping type, wherein the upper portion of the first base layer separates a lower surface of the second base layer from the E/C layer.

Additional embodiments of the disclosure provide a method of forming a lateral bipolar transistor structure, the method including: forming a semiconductor layer on an insulator; forming an emitter/collector (E/C) layer on the semiconductor layer, the E/C layer having a first doping type; forming a first base layer on the semiconductor layer and horizontally adjacent the E/C layer, the first base layer having a second doping type opposite the first doping type and the first base layer including: a lower portion having a first horizontal width from the E/C layer, and an upper portion on the lower portion and having a second horizontal width from the E/C layer greater than the first horizontal width; and forming a second base layer on the first base layer and adjacent a spacer, the second base layer having the first doping type, wherein the upper portion of the first base layer separates a lower surface of the second base layer from the E/C layer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
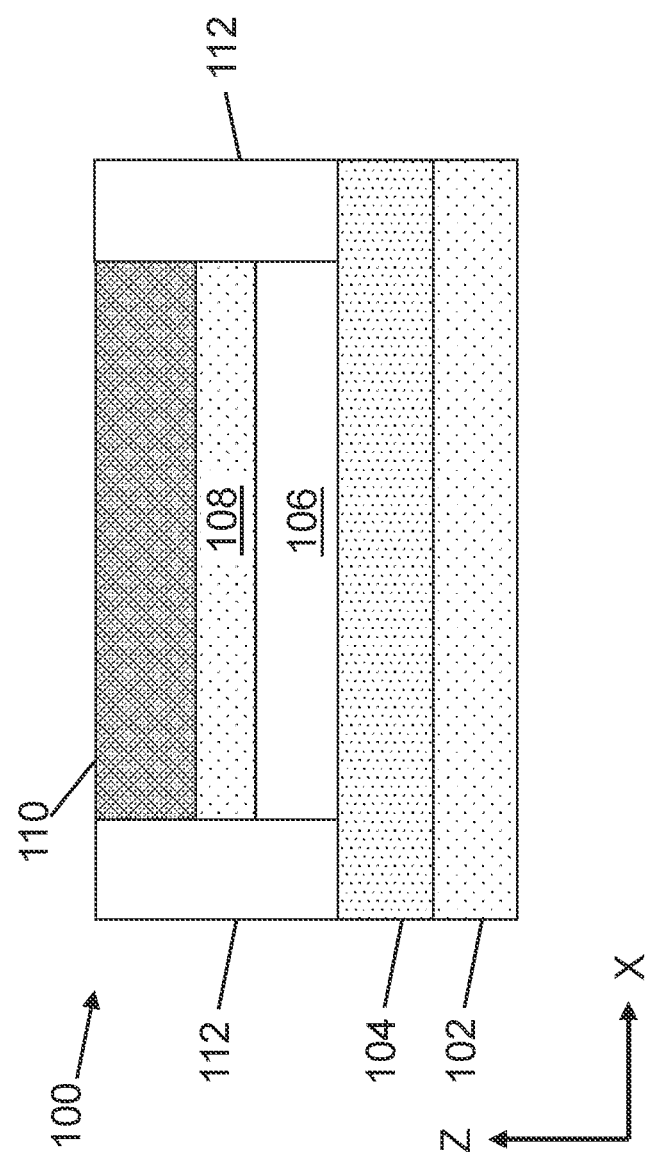
FIG. 1 provides a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over"

another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a lateral bipolar transistor structure with a base layer of varying horizontal width adjacent an emitter/collector layer. The lateral bipolar transistor structure may include an emitter/collector (E/C) layer of semiconductor material that is above a semiconductor layer. The E/C layer may have a first doping type, e.g., P type or N type. A first base layer, with an opposite doping type from the E/C layer, is on the semiconductor layer and adjacent the E/C layer. The first base layer may have a lower portion featuring a first horizontal width from the E/C layer, and an upper portion that has a second, greater horizontal width from the E/C layer. A second base layer may be on the upper portion of the first base layer such that the upper portion of the first base layer separates a lower surface of the second base layer from the E/C layer. The E/C layer may extend partially below the upper portion of the first base layer, thus constraining the width of the first base layer as compared to other bipolar transistor configurations.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the physical interface between the two semiconductor materials.

Referring to FIG. 1, a preliminary structure 100 (simply "structure" hereafter) suitable to form a lateral bipolar transistor structure according to embodiments of the disclosure is shown. Preliminary structure 100 may be processed as described herein to yield one or more lateral bipolar transistor structures. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. A doped well region 104 may be included on or within substrate 102, e.g., to enable electrical biasing of structures or components formed above substrate 102. Doped well region 104 may have the same dopant type as substrate 102 (e.g., P type doping), but may have a higher dopant concentration therein.

Structure 100 may include embedded elements for electrically separating active materials formed over substrate 102 from other regions and/or materials. An insulator 106 optionally may be formed over doped well region 104 and substrate 102, e.g., by forming a layer of dielectric material (e.g., oxide or nitride insulative material), converting silicon material within substrate 102 or doped well region 104 into a higher-resistive material such as polycrystalline or amorphous silicon (poly-Si), or other techniques.

A semiconductor layer 108 and a doped semiconductor layer 110 may be on insulator 106 and may include any currently known or later developed semiconductor material (e.g., any of those described herein regarding substrate 102). Semiconductor layer 108 and/or doped semiconductor layer 110 may be formed by deposition and/or epitaxial growth of silicon and/or other semiconductor materials on insulator 106 and may have a predetermined doping type, e.g., by being doped in-situ or during formation of doped semiconductor layer 110. In some cases, semiconductor layer 108 may include silicon (e.g., polycrystalline silicon) while doped semiconductor layer 110 may include silicon germanium (SiGe). According to an example, semiconductor layer 108 may be undoped or only lightly doped, while doped semiconductor layer 110 may be more highly doped N type to provide active semiconductor material for use in the base terminal of an eventual lateral bipolar transistor structure.

Insulator 106 may extend horizontally throughout structure 100, and/or may be formed selectively under locations where active materials are formed, examples of which are discussed elsewhere herein. In further implementations, insulator 106 may include oxygen doping to form a dielectric insulator or a buried oxide ("BOX") layer over substrate 102 to electrically isolate semiconductor layer 108 from substrate 102. Insulator 106 may include other elements or molecules such as Ge, N, or Si. However embodied, insulator 106 may be sized as narrow as possible to provide better interaction with overlying semiconductor materials (e.g., semiconductor layer 108, doped semiconductor layer 110 and components formed thereon or therefrom), and in various embodiments may have a thickness that is at most approximately twenty-five nanometers (nm) to approximately five-hundred nm. Some portions (not shown) of substrate 102 may not have insulator 106 thereover, and/or multiple layers of insulator 106 may be formed on substrate 102 to varying thicknesses. Additionally, various conductive particles ("dopants") may be introduced into substrate 102 via a process known as "pre-doping" of substrate 102.

Structure 100 (FIG. 1) may include a set of trench isolations (TIs) 112 by forming and filling trenches (not labeled) with an insulating material such as oxide, to horizontally isolate insulator 106, semiconductor layer 108, and doped semiconductor layer 110 from any adjacent regions of material. Various portions of a bipolar transistor structure, including the active semiconductor materials thereof and/or other devices where applicable, may be formed on or from portions of insulator 106 and doped semiconductor layer 110 that are isolated by TI(s) 112. According to one example, two TIs 112 are formed, with insulator 106, semiconductor layer 108, and doped semiconductor layer 110 being horizontally between the two TIs 112. TIs 112 may be formed before active materials are formed over substrate 102, but this is not necessarily true in all implementations.

Each TI 112 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI(s) 112 and doped semiconductor layer 110 may be planarized (e.g., by chemical mechanical planarization or other technique(s)) such that the upper surface(s) thereof is/are substantially coplanar with each other.

Figure 2:
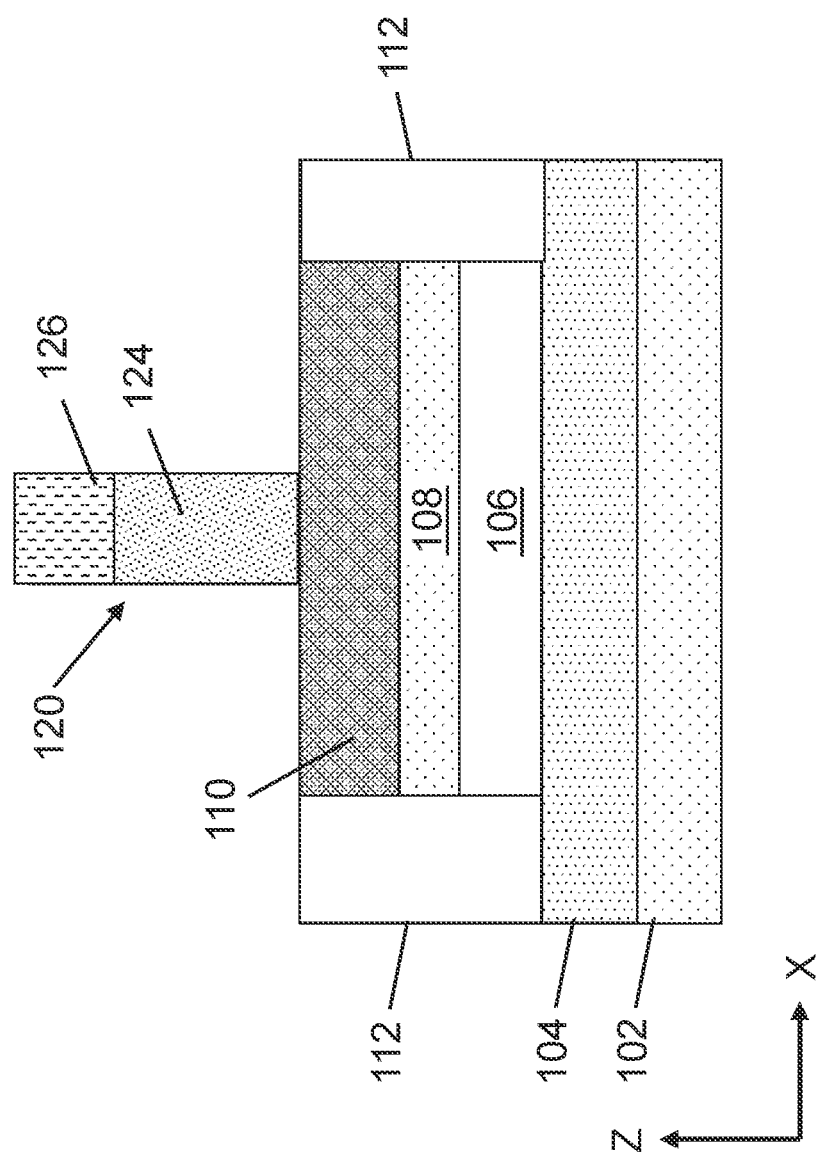
FIG. 2 provides a cross-sectional view of forming a base structure according to embodiments of the disclosure.

FIG. 2 depicts forming a base assembly 120 on doped semiconductor layer 110, e.g., to allow subsequent or independent processing of doped semiconductor layer 110 according to embodiments of the disclosure. The forming of base assembly 120 may include forming a base material 124 (e.g., doped or non-doped SiGe or other doped semiconductor material(s)) on doped semiconductor layer 110. Base material 124 may have the same doping type as doped semiconductor layer 110, and thus may provide active semiconductor material within the eventual bipolar transistor structure. In other cases, base material 124 may not form part of the eventual bipolar transistor structure and may be formed as a placeholder material within base assembly 120 for later removal and replacement with other active and/or insulative materials. In addition, embodiments of the disclosure may include forming an insulative cap 126 on base material 124, e.g., by depositing a layer of insulative material such as an oxide or nitride insulator and removing selected areas of material such that insulative cap 126 remains on base material 124.

Figure 3:
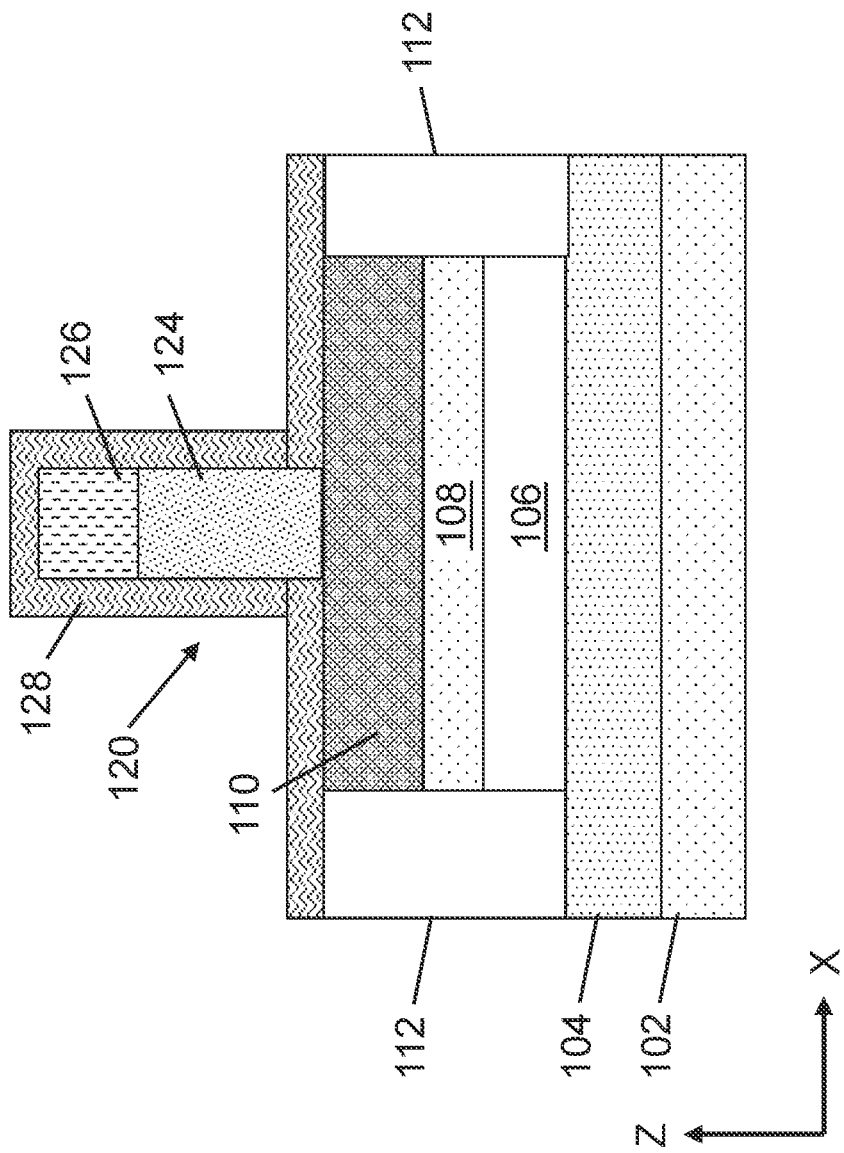
FIG. 3 provides a cross-sectional view of forming a spacer layer according to embodiments of the disclosure.

FIG. 3 depicts forming a spacer layer 128 on base assembly 120 and adjacent portions of doped semiconductor layer 110 and TI(s) 112. Spacer layer 128 may be formed to a thickness that is less than insulative cap 126, or any other desired thickness. However, spacer layer 128 may include a layer of insulating material that is different from insulative cap 126. For instance, spacer layer 128 may include one or more nitride insulators (e.g., SiN) in the case where insulative cap 126 includes an oxide insulator.

Figure 4:
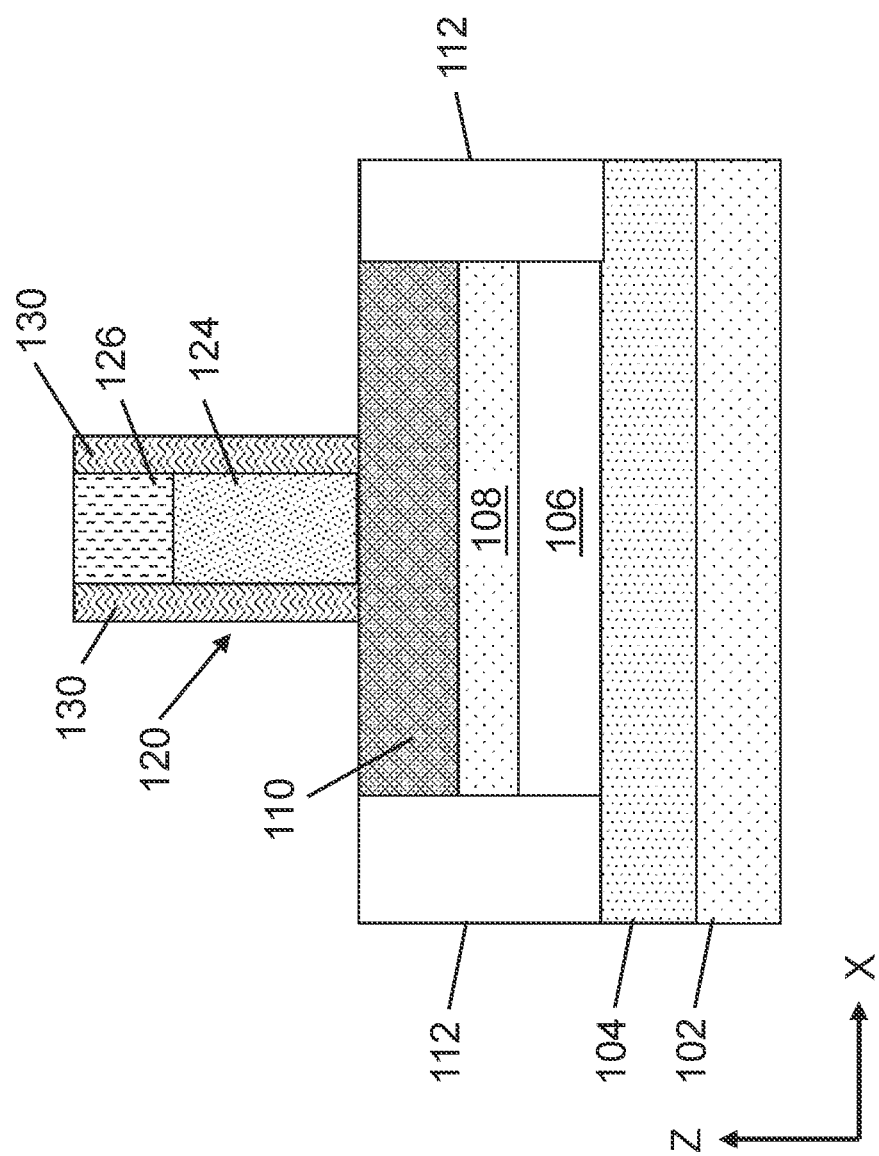
FIG. 4 provides a cross-sectional view of forming a spacer according to embodiments of the disclosure.

Turning to FIG. 4, spacer layer 128 (FIG. 3) may be processed into a set of spacers 130 for physical and electrical separation of emitter, base, and collector terminals of a lateral bipolar transistor. To create spacers 130 on sidewalls of base assembly 120, horizontally extending portions of spacer layer 128 may be removed by a vertically oriented removal process (e.g., reactive ion etching (RIE)) and/or similar processes. In this case, vertically extending portions of spacer layer 128 located adjacent base assembly 120 will remain intact even as other portions of spacer layer 128 are removed. Parameters such as etching time may be controlled such that portions of doped semiconductor layer 110, TI(s) 112, and/or insulative cap 126 below spacer layer 128 are not removed to a significant degree.

Figure 5:
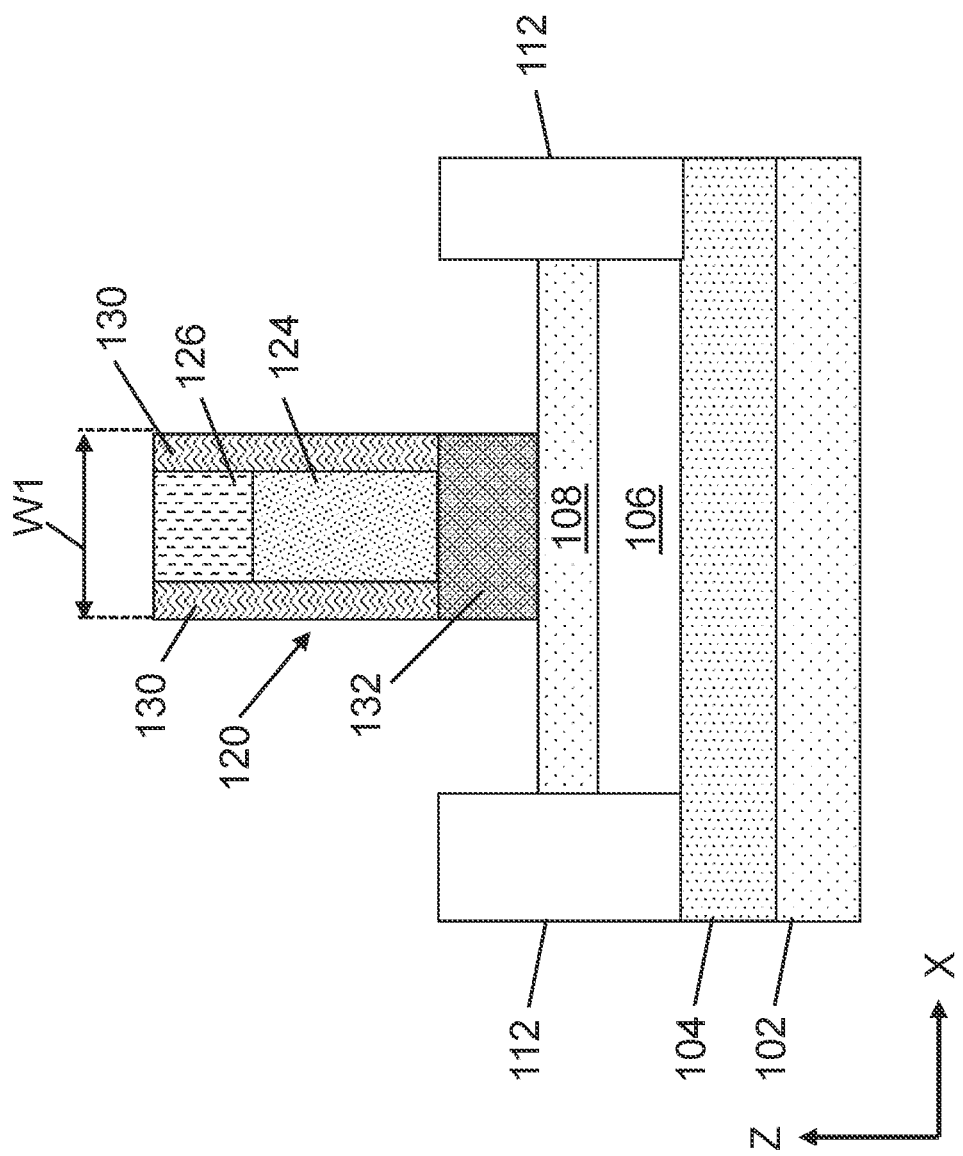
FIG. 5 provides a cross-sectional view of removing portions of doped semiconductor material according to embodiments of the disclosure.

FIG. 5 depicts processing of doped semiconductor layer 110 to form a base material 132 below base assembly 120. Here, portions of doped semiconductor layer 110 can be removed without affecting other components of the structure by use of one or more selective removal techniques and/or other processes to remove, for example, SiGe, without affecting insulative materials. In one example, doped semiconductor layer 110 can be subjected to selective RIE to target and remove only vertically exposed portions of doped semiconductor layer 110. This approach may cause portions of doped semiconductor layer 110 below base assembly 120 to remain intact as base material 132. Other material(s) below doped semiconductor layer 110, e.g., semiconductor layer 108, may be exposed after the overlying portions of doped semiconductor layer 110 are removed. Semiconductor layer 108 may be used as a seed layer for epitaxial growth of additional semiconductor layers in subsequent processing. In the case of vertically oriented etching, base material 132 and base assembly 120 (including spacers 130) each may have the same horizontal width, e.g., horizontal width W1.

Figure 6:
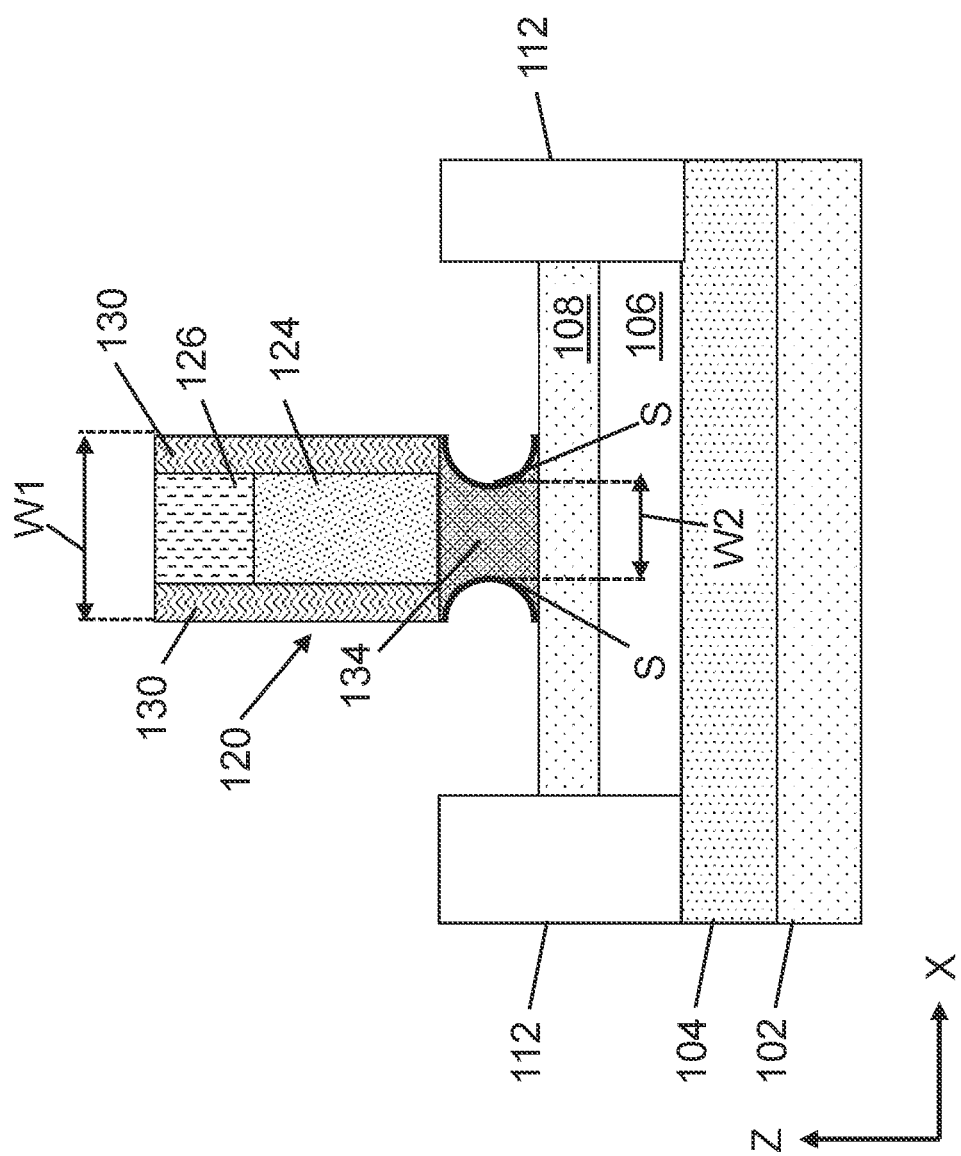
FIG. 6 provides a cross-sectional view of inwardly recessing the doped semiconductor material to form a first base layer according to embodiments of the disclosure.

Turning to FIG. 6, embodiments of the disclosure include forming a first base layer 134 from base material 132 (FIG. 5). First base layer 134 may be formed, e.g., by performing a "ball etch," selectively etching base material 132 (e.g., in the case where base material 132 includes SiGe but semiconductor layer 108 includes Si without any significant Ge concentration), or other processes to remove only horizontally exposed portions of first base layer 134 below base assembly 120. The term "ball etch," as used herein, refers to an etching process in which a wet etchant (e.g., nitric acid and hydrofluoric acid mix, potassium hydroxide, etc.) or other etchant with similar properties is introduced within an opening to contact material(s) therein. Such an opening may include the space over semiconductor layer 108 between base assembly 120 and TI(s) 112 to remove targeted semiconductor material that is located within the opening. The removed material may take on a rounded or "ball" type shape, thereby defining a rounded (e.g., concave) surface within the remaining material.

First base layer 134 may include a pair of sidewall S with a concave surface, such that the uppermost portion of first base layer 134 has a first horizontal width W1 (e.g., the same horizontal width as base assembly 120) and an underlying portion of first base layer 134 has a second horizontal width W2 that is less than horizontal width W2. These relative widths of first base layer 134 may be present in the eventual bipolar transistor structure, e.g., to affect conductivity between the base terminal and collector or emitter terminals of the structure.

Figure 7:
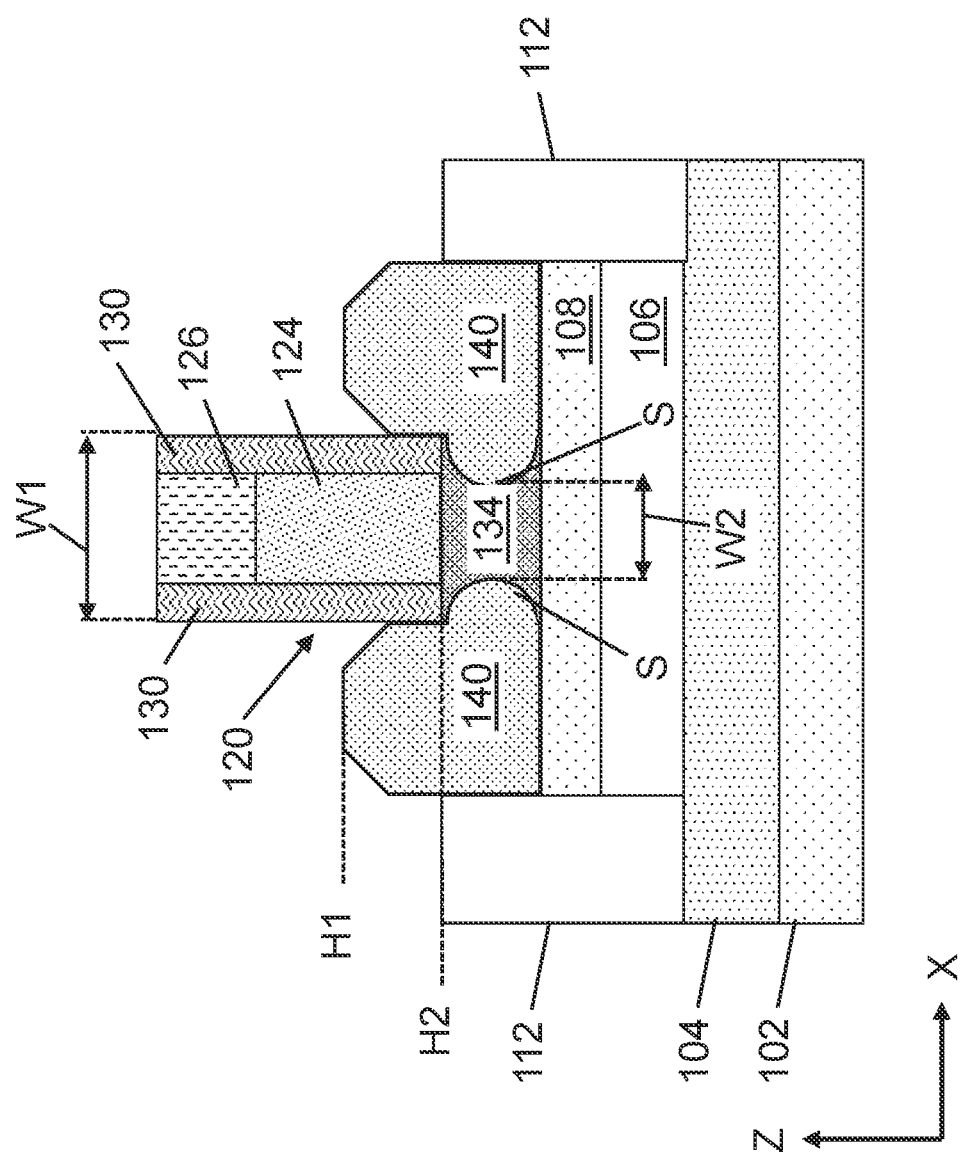
FIG. 7 provides a cross-sectional view of forming an emitter/collector (E/C) layer according to embodiments of the disclosure.

Turning to FIG. 7, further processing may include forming a set of emitter/collector (E/C) layers 140 on semiconductor layer 108 and horizontally between first base layer 134 and TI(s) 112. E/C layers 140 may define all or part of the active bipolar transistor materials for emitter and collector terminals of a bipolar transistor structure. E/C layers 140 may be formed on respective portions of semiconductor layer 108, e.g., by epitaxial growth or deposition of doped semiconductor material. E/C layers 140 may include the same material composition as first base layer 134 (e.g., doped SiGe), but with an opposite doping type (e.g., they may be doped N type when first base layer 134 is doped P type or vice versa). E/C layers 140 additionally or alternatively may include other electrically active semiconductor materials. E/C layers 140 may be formed to a desired thickness above semiconductor layer 108. In the case where E/C layers 140 are formed through epitaxial growth, they may extend to a height H1 above an upper surface of semiconductor layer 108 that is greater than a height H2 of first base layer 134 above the upper surface of semiconductor layer 108. In this case, E/C layer(s) 140 may abut spacer(s) 130 of base assembly 120.

Figure 8:
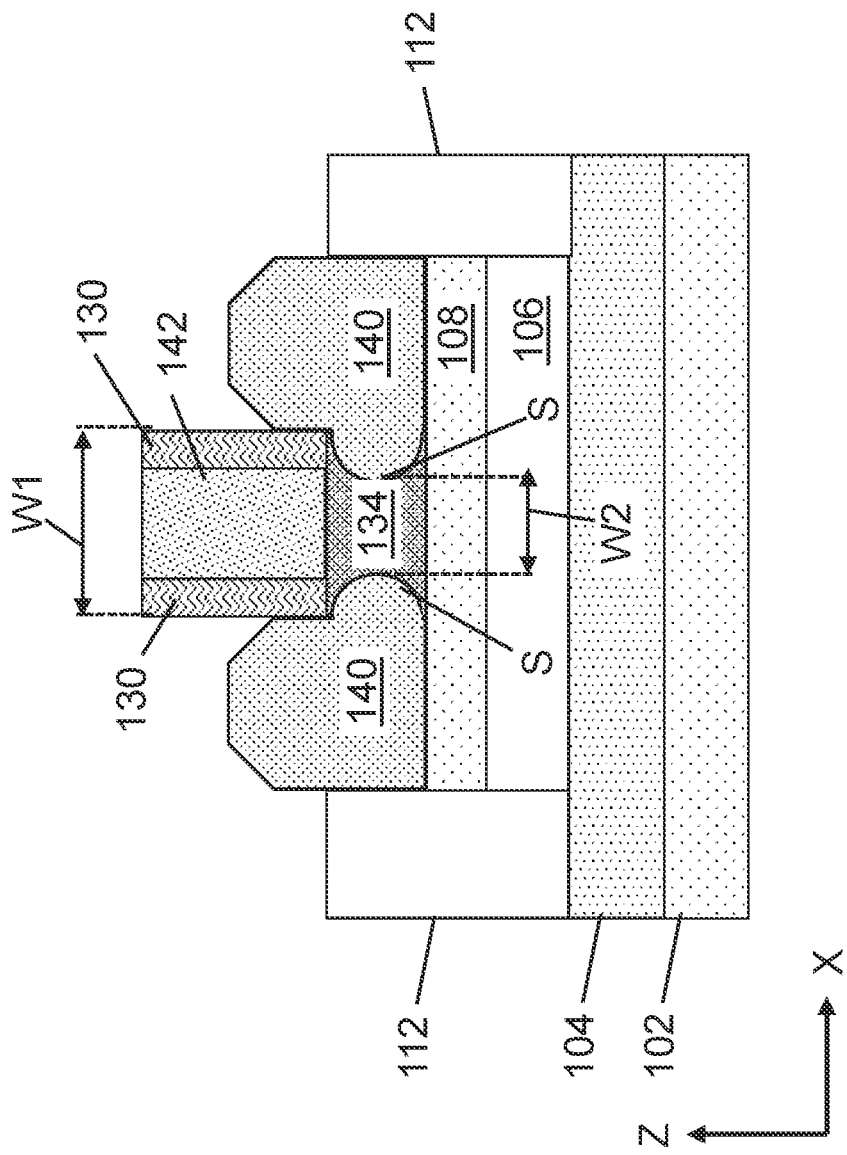
FIG. 8 provides a cross-sectional view of forming a second base layer over the first base layer according to embodiments of the disclosure.

FIG. 8 depicts processing of base assembly 120 to form a second base layer 142 over first base layer 134. Here, processes such as selective or non-selective etching of insulative cap 126 (FIGS. 2-7), spacer 130, and possibly base material 124 may remove insulative cap 126 and reduce the height of spacer(s) 130 over first base layer 134. In addition or alternatively, dopants may be introduced into base material 124 to increase its conductivity relative to first base layer 134. Thus, base material 124 may be converted into second base layer 142 due to the removing of overlying components and/or additional doping of base material 124. Second base layer 142 may have a higher concentration of dopants than first base layer 134, or semiconductor layer 108 (the latter of which is electrically inactive). Second base layer 142, in addition, may retain the same width as base material 124 and thus may have the same width as upper portions of first base layer 134 thereunder. Due to the earlier processing of first base layer 134 (e.g., horizontal recessing via ball etch), no portion of second base layer 142 may contact and overlie E/C layer(s) 140.

In the eventual lateral bipolar transistor structure, first base layer 134 may define a lightly doped intrinsic base region, while second base layer 142 may define a highly doped extrinsic base region of the transistor. In some cases, first base layer 134 may be adjacent only E/C layer(s) 140 and second base layer 142 may be adjacent only spacer(s) 130. The higher dopant concentration in second base layer 142 may increase electrical conductivity between second base layer 142 and any overlying contacts for controlling the flow of current through the lateral bipolar transistor structure.

Figure 9:
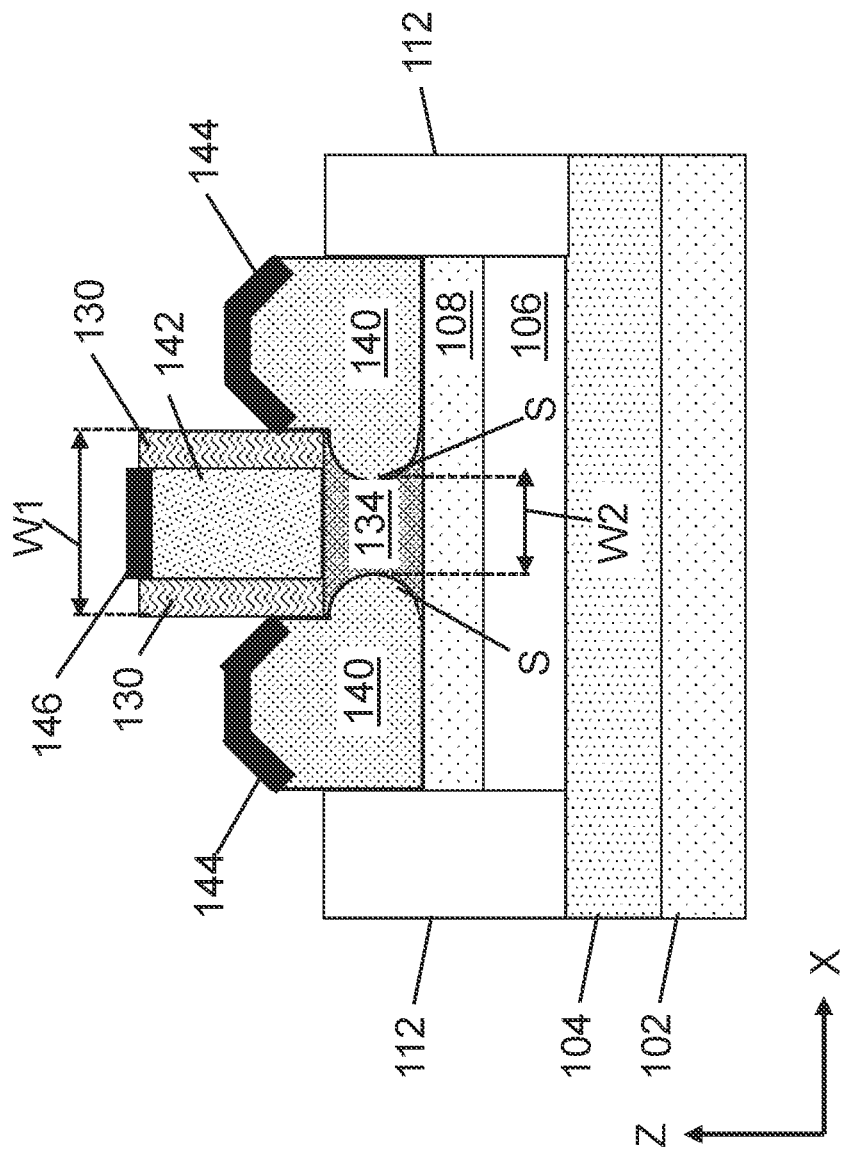
FIG. 9 provides a cross-sectional view of forming emitter, collector, and base silicide layers according to embodiments of the disclosure.

FIG. 9 depicts forming a set of E/C silicide layers 144 on E/C layer(s) 140. E/C silicide layers 144 may be formed to enhance the electrical conductivity between E/C layers 140 and conductors formed thereon. E/C silicide layers 144 may be formed by forming a conductive metal (e.g., cobalt, titanium, nickel, platinum, or other materials) on E/C layers 140, annealing the metal to yield conductive silicide material(s) (e.g., cobalt silicide, titanium silicide, etc.) on upper surfaces of E/C layers 140, and removing excess conductive metal. Silicide layers 144 may be formed to allow for stronger electrical coupling to overlying contacts. Additionally, a base silicide layer 146 may be formed on second base layer 142 in substantially the same manner as E/C silicide layers 144.

Figure 10:
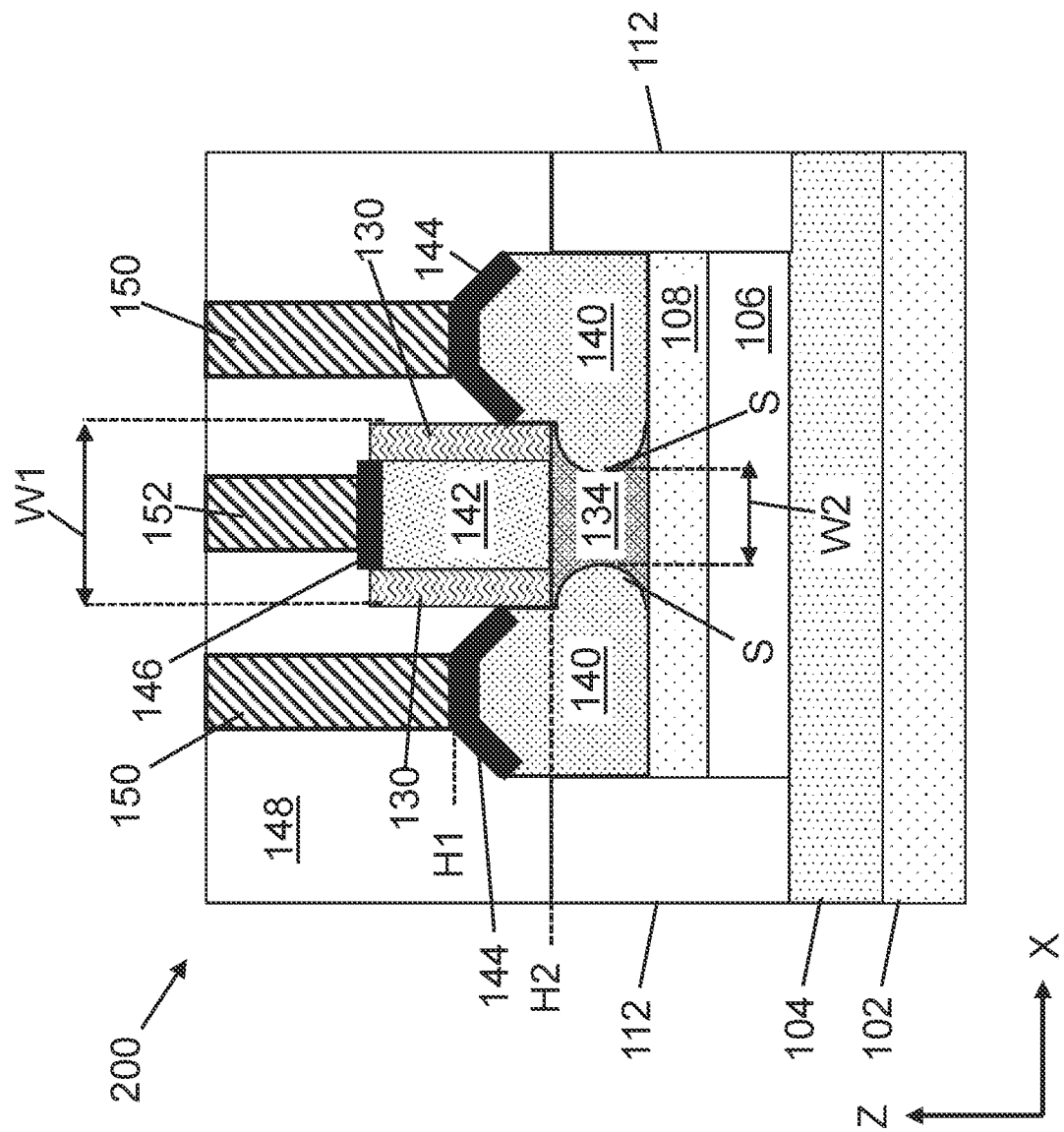
FIG. 10 provides a cross-sectional view of a lateral bipolar transistor structure according to embodiments of the disclosure.

FIG. 10 depicts forming an inter-level dielectric (ILD) layer 148 over TI(s) 112, spacer(s) 130, E/C layer(s) 140, second base layer 142, etc., by deposition or other techniques of forming an insulative material on a structure. Additional metallization layers (not shown) may be formed on ILD layer 148 in subsequent processing during middle-of-line and/or back-end-of-line processing. ILD layer 148 may include any currently known or later developed insulative layer, e.g., those included within insulator 106 and/or TI(s) 112. Despite ILD layer 148 possibly having a similar or identical composition to such materials, it is formed separately from other insulative material and boundaries and/or physical interfaces between ILD layer 148 and other such materials may be present in the structure. To electrically couple E/C layers 140 to overlying layers and/or structures, a set of E/C contacts 150 may be formed to E/C layers 140 (e.g., via E/C silicide layers 144) and within ILD layer 148. Similarly, a set of base contacts 152 may be formed on second base layer 142 (e.g., via base silicide layer 146) and within ILD layer 148.

FIG. 10 depicts a lateral bipolar transistor structure 200 according to embodiments of the disclosure. E/C layer 140 may be on semiconductor layer 108 and above insulator 106. First base layer may also be on semiconductor layer 108 and horizontally adjacent E/C layer 140. Second base layer 142 may be on first base layer 134 and adjacent spacer 130. Second base layer 142, in addition, may have the same doping type as first base layer 134 but in a higher concentration. Second base layer 142 thus may define an extrinsic base region of lateral bipolar transistor structure 200 while first base layer 134 may define a less highly doped intrinsic base region of lateral bipolar transistor structure 200. Spacer 130 thus may be horizontally interposed between E/C layer 140 and second base layer 142 to prevent electrical shorting from E/C layer 140 to second base layer 142. As discussed elsewhere herein, E/C layer 140 may have a height H1 above the upper surface of semiconductor layer 108 that is greater than height H2 of first base layer 134 above the upper surface of semiconductor layer 108.

Figure 11:
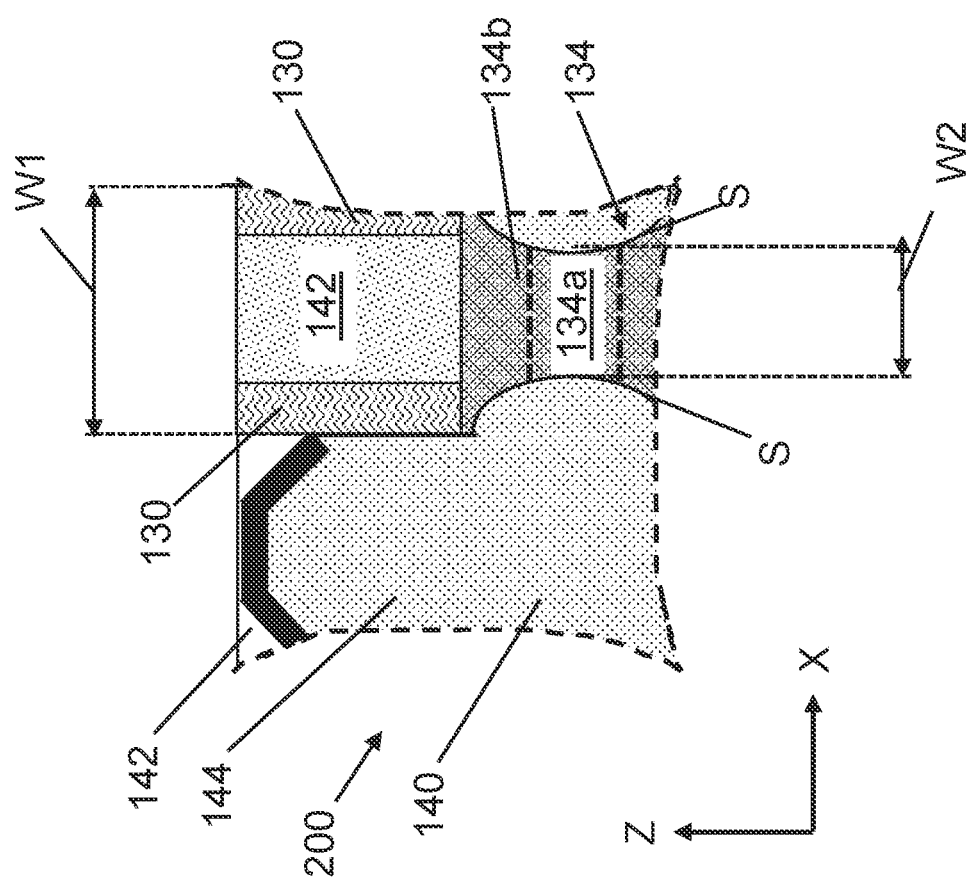
FIG. 11 provides an expanded partial cross-sectional view of a first base layer and adjacent components of the bipolar transistor structure according to embodiments of the disclosure.

Turning to FIG. 11, an expanded partial cross-sectional view of lateral bipolar transistor structure 200 is shown to further illustrate structural aspects of first base layer 134. FIG. 11 includes dotted lines to indicate where portions of lateral bipolar transistor structure 200 are omitted. First base layer 134 may be subdivided into multiple portions, e.g., a lower portion 134a adjacent E/C layer 140, and an upper portion 134b that is on lower portion 134a and below second base layer 142. Lower portion 134a may be inwardly horizontally recessed such that its horizontal width from (or between) E/C layer(s) 140 is less than the horizontal width of upper portion 134b from (or between) E/C layer(s) 140. For instance, upper portion 134b may have first horizontal width W1 that is approximately the same as the combined horizontal width of second base layer 142 and spacer(s) 130. Lower portion 134a, however, may have a smaller horizontal width W2 that is less than or at most approximately equal to the horizontal width of second base layer 142.

The relative dimensions of portions 134a, 134b of first base layer 134 may vary widely between implementations. For instance, horizontal width W2 of lower portion 134a may be at most approximately five nanometers (nm) in some implementations, with horizontal width W1 of upper portion 134b being at most approximately one-hundred nm in such implementations. These aspects of first base layer 134 may define a substantially hourglass shaped structure, in which sidewall surfaces S of first base layer 134a are concave. It is also understood that first base layer 134 may have any other conceivable shape in which horizontal width W1 of upper portion 134b is greater than horizontal width W2 of lower portion 134a. Portions 134a, 134b may be distinguishable solely based on their dimensions, with no physical interface being present between portions 134a, 134b within first base layer 134. Moreover, the greater horizontal width W1 in upper portion 134b may be at least large enough to prevent any part of second base layer 142 from touching E/C layer 140. An electrical pathway from E/C layer 140 to second base layer 142 thus must pass through first base layer 134 during operation.

Figure 12:
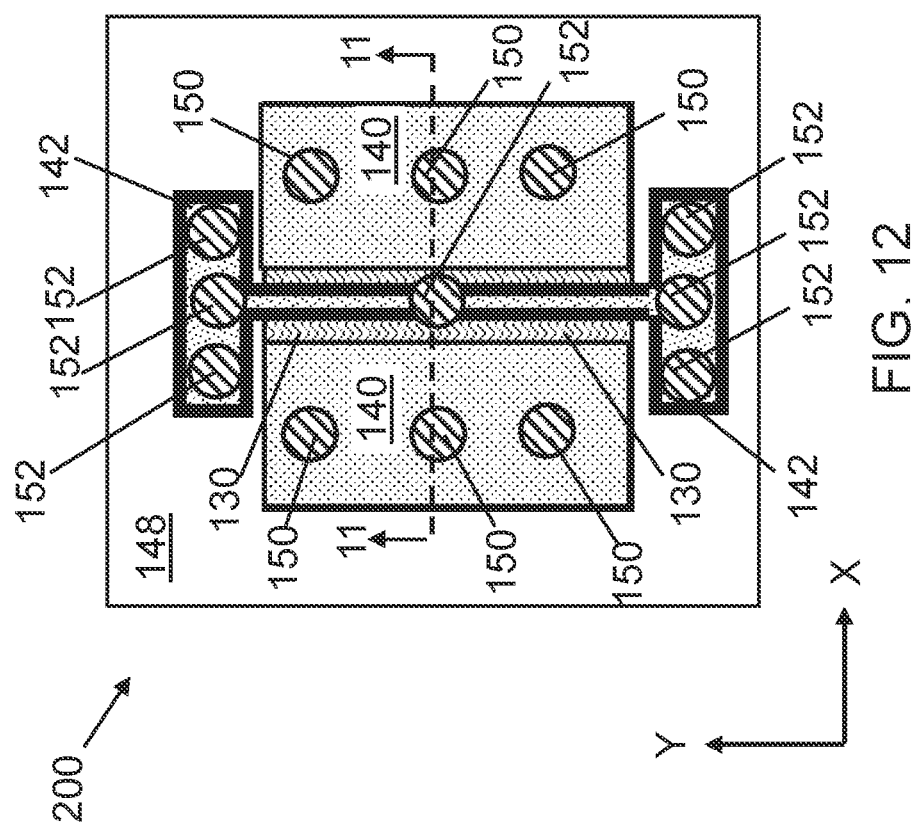
FIG. 12 provides a plan view of a lateral bipolar transistor structure according to embodiments of the disclosure.

FIG. 12 illustrates a plan view of lateral bipolar transistor structure 200 in plane X-Y to further illustrate aspects of E/C layers 140, second base layer 142, and contacts 150, 152 thereto. Line 11-11 indicates the location of the cross-sectional view in FIG. 11. To provide increased electrical control over the operation of lateral bipolar transistor structure 200, second base layer 142 may be substantially I-shaped in plane XY, in which multiple base contacts 152 electrically couple to second base layer 142 at multiple positions. The substantially I-shaped second base layer 142 may allow, e.g., a larger number of base contacts 152 to be formed to lateral bipolar transistor structure 200 than may be possible at locations that are adjacent spacer(s) 130. However, some base contacts 152 nevertheless may be present on second base layer 142 in locations that are adjacent spacer(s) 130. In this example configuration, E/C layer(s) 140 may include multiple E/C contacts 150 thereto to define electrical couplings to the base and emitter terminals of lateral bipolar transistor structure 200.

Embodiments of the disclosure may provide several technical advantages. Lateral bipolar transistor structure 200 includes first base layer 134 of varying widths, to provide a larger physical interface between first base layer 134 and E/C layer 140 through a non-vertical sidewall than would be possible through a vertical sidewall and/or rectangularly (cross-section) shaped first base layer. The processing of first base layer 134 may be controlled (e.g., using a ball etch or similar technique) to prevent a direct physical interface from forming between E/C layer(s) 140 and second base layer 142. These improvements, moreover, can be integrated into a conventional layout for a lateral bipolar transistor, and with few changes to the type and number of processes needed to form a bipolar transistor structure. These and other features of the disclosure may provide improvements to gain and frequency of operation, e.g., due to increased electron mobility. Embodiments of the disclosure can be implemented using existing CMOS processing techniques and/or masking materials.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A lateral bipolar transistor structure comprising:
   an emitter/collector (E/C) layer on a semiconductor layer;
   a first base layer on the semiconductor layer and horizontally adjacent the E/C layer and including:
      an upper portion having a first horizontal width from the E/C layer,
      a lower portion under the upper portion and having a second horizontal width from the E/C layer less than the first horizontal width, and
      a sidewall adjacent the E/C layer including a concave surface; and
   a second base layer on the first base layer and adjacent a spacer, wherein the upper portion of the first base layer separates a lower surface of the second base layer from the E/C layer.

2. The lateral bipolar transistor structure of claim 1, further comprising a spacer adjacent the second base layer and on the upper portion of the first base layer, wherein a portion of the E/C layer is below the spacer.

3. The lateral bipolar transistor structure of claim 2, wherein the combined horizontal width of the spacer and the second base layer is the same as the first horizontal width.

4. The lateral bipolar transistor structure of claim 1, wherein a second dopant concentration of the second base layer is greater than a first dopant concentration of the first base layer and the semiconductor layer.

5. The lateral bipolar transistor structure of claim 1, wherein a height of the E/C layer over the semiconductor layer is greater than a height of the first base layer over the semiconductor layer.

6. The lateral bipolar transistor structure of claim 1, wherein the second horizontal width of the lower portion of the first base layer is at most approximately five nanometers (nm), and wherein the first horizontal width of the upper portion of the first base layer is at most approximately one-hundred nm.

7. The lateral bipolar transistor structure of claim 1, wherein the first base layer is substantially hourglass shaped.

8. The lateral bipolar transistor structure of claim 1, wherein the first base layer is substantially I shaped.

9. The lateral bipolar transistor structure of claim 1, wherein the first base layer physically contacts the semiconductor layer.

10. A lateral bipolar transistor structure comprising:
a semiconductor layer on an insulator;
an emitter/collector (E/C) layer on the semiconductor layer, the E/C layer having a first doping type;
a first base layer on the semiconductor layer and horizontally adjacent the E/C layer, the first base layer having a second doping type opposite the first doping type and including:
an upper portion having a first horizontal width from the E/C layer,
a lower portion under the upper portion and having a second horizontal width from the E/C layer less than the first horizontal width, and
a sidewall adjacent the E/C layer including a concave surface;
a spacer on the upper portion of the first base layer and adjacent the E/C layer, wherein an upper portion of the E/C layer is adjacent the spacer and a lower portion of the E/C layer is below the spacer; and
a second base layer on the first base layer and adjacent the spacer, the second base layer having the first doping type, wherein the upper portion of the first base layer separates a lower surface of the second base layer from the E/C layer.

11. The lateral bipolar transistor structure of claim 10, wherein a second dopant concentration of the second base layer is greater than a first dopant concentration of the first base layer and the semiconductor layer.

12. The lateral bipolar transistor structure of claim 10, wherein a lower surface of the second base layer does not physically interface with any portion of the E/C layer.

13. The lateral bipolar transistor structure of claim 10, wherein the second horizontal width of the lower portion of the first base layer is at most approximately five nanometers (nm).

14. The lateral bipolar transistor structure of claim 13, wherein the first horizontal width of the upper portion of the first base layer is at most approximately one-hundred nm.

15. The lateral bipolar transistor structure of claim 10, wherein the first base layer is substantially hourglass shaped.

16. A method of forming a lateral bipolar transistor structure, the method comprising:
forming a semiconductor layer on an insulator;
forming an emitter/collector (E/C) layer on the semiconductor layer, the E/C layer having a first doping type;
forming a first base layer on the semiconductor layer and horizontally adjacent the E/C layer, the first base layer having a second doping type opposite the first doping type and the first base layer including:
an upper portion having a first horizontal width from the E/C layer,
a lower portion under the upper portion and having a second horizontal width from the E/C layer less than the first horizontal width, and
a sidewall adjacent the E/C layer including a concave surface, and
forming a second base layer on the first base layer and adjacent a spacer, the second base layer having the first doping type, wherein the upper portion of the first base layer separates a lower surface of the second base layer from the E/C layer.

17. The method of claim 16, further comprising forming the spacer adjacent the second base layer and on the upper portion of the first base layer, wherein a portion of the E/C layer is below the spacer.

18. The method of claim 16, wherein forming the second base layer includes introducing dopants into the second base layer such that a dopant concentration of the second base layer is greater than a dopant concentration of the first base layer.

19. The method of claim 16, wherein forming the E/C layer causes a height of the E/C layer over the semiconductor layer to be greater than a height of the first base layer over the semiconductor layer.

20. The method of claim 16, wherein forming the first base layer includes forming the lower portion of the first base layer with the second horizontal width of at most approximately five nanometers (nm), and forming the upper portion of the first base layer to have the first horizontal width of at most approximately one-hundred nm.

* * * * *